United States Patent [19]

Hachiya

[11] Patent Number: 6,031,979
[45] Date of Patent: Feb. 29, 2000

[54] CIRCUIT PARTITIONING APPARATUS FOR EXECUTING PARALLEL CIRCUIT SIMULATION AND METHOD THEREFOR

[75] Inventor: Koutaro Hachiya, Tokyo, Japan

[73] Assignee: NEC Corporation, Tokyo, Japan

[21] Appl. No.: 08/866,681

[22] Filed: May 30, 1997

[30] Foreign Application Priority Data

May 30, 1996 [JP] Japan ................................. 8-136671

[51] Int. Cl.[7] .................................................. G06F 17/50
[52] U.S. Cl. ............................... 395/500.08; 395/500.02; 395/500.03; 395/500; 395/34; 395/500.35
[58] Field of Search .................................... 364/488, 489, 364/490, 491, 578; 395/500.08, 500.02, 500.03, 500.34, 500.35

[56] References Cited

U.S. PATENT DOCUMENTS 5,392,429  2/1995  Agrawal et al. .......................... 395/650
5,684,723  11/1997  Nakadai ................................... 364/578

OTHER PUBLICATIONS

Chen et al "A Parallel Simulation Approach to Optimum Circuit Design," IEEE, pp. 863–866, 1992.
Schlagenhaft et a "Dynamic Load Balancing of a Multi-Cluster Simulator on a Network of Workstations," IEEE, pp. 175–180, 1995.
Rahman et al "Parallel Simulation of Mesh Routing Algorithms," IEEE, pp. 158–165, Jan. 1996.
P.M. Lin "A Circuit Characterization of Principal and Refined Partition of Graphs," IEEE, pp. 994–997, 1991.
N. Kalantery "Real–Time Speed of a Conservative Parallel Simulation," IEEE, pp. 416–423, Jan. 1996.
Kapp et al "An Improved Cost Function for Static Partitioning of Parallel Circuit Simulations Using a Conservative Synchronization Protocol," IEEE, pp. 78–85, Jun. 1995.
"Development of Parallelism for Circuit Simulation by Tearing", The European Conference on Design Automation, 1993, pp. 12–17.
Yeh et al "Partitioning Issues in Circuit Simulation on Multiprocessors," IEEE, pp. 300–303, 1988.
Teo et al "Performance Analysis of Mapping Strategies for Parallel Simulation," IEEE, pp. 387–396, Jan. 1996.
Blalek et al "An Automatic Clustering Algorithm Using Facterization Tree for Parallel Power System Simulation," IEEE, pp. 980–983, 1994.
Konas et al "Partitioning for Synchronous Parallel Simulation," IEEE, pp. 181–184, Jun. 1995.

*Primary Examiner*—Kevin J. Teska
*Assistant Examiner*—Vuthe Siek
*Attorney, Agent, or Firm*—Scully, Scott, Murphy & Presser

[57] ABSTRACT

A circuit partitioning apparatus comprising an update operation times counting section that decomposes into the product of triangular matrixes the circuit matrix of each subcircuit composed of clusters generated by an initial clustering section; and a computation time prediction section that uses the results of counting by the update operation times counting section to predict simulation computation time required by a simulation execution time, prior to the execution of simulation, wherein the initial clustering section and a min-cut section feed back the results of the prediction section to carry out clustering and min-cut in order to create subcircuits that require equal computation time for circuit simulation.

9 Claims, 9 Drawing Sheets

CIRCUIT PARTITIONING APPARATUS FOR EXECUTING PARALLEL CIRCUIT SIMULATION AND METHOD THEREFOR

BACKGROUND OF THE INVENTION

1. Field of the Invention

The present invention relates to a circuit partitioning apparatus and method used in parallel circuit simulation to uniformly partition a target circuit prior to the execution of circuit simulation.

2. Description of the Related Art

To design a circuit, circuit simulation is executed using a computer system so that the circuit exhibits the desired performance. To carry out circuit simulation at a high speed, simulation systems that partition a target system into a plurality of circuits for parallel simulation computations have been proposed. In such simulation systems, the accuracy of simulation and the speed required for computations are significantly affected by the method used to partition a target circuit.

Circuit partitioning methods for efficiently executing circuit simulation in parallel comprise minimizing the number of nodes that connect subcircuits into which a target circuit is partitioned and making the computation time for the simulation of each subcircuit, uniform, that is the load on the computation of the subcircuit. The computation time for simulation, that is, the magnitude of the load on the computation of the subcircuit is hereafter simply referred to as the "magnitude of load".

The conventional predicted value of the magnitude of the load on a subcircuit is the sum (Kt Nt+Kn Nn) of the value Kt Nt of the time required to make a circuit matrix by computing an electric characteristic model of the elements in the subcircuit (model computation time), which value is predicted based on the number of the elements (the number of transistors) Nt, and the value Kn Nn of the matrix computation time predicted based on the number of nodes Kn, wherein Kt and Kn are proportional coefficients (constants).

Figure 8:
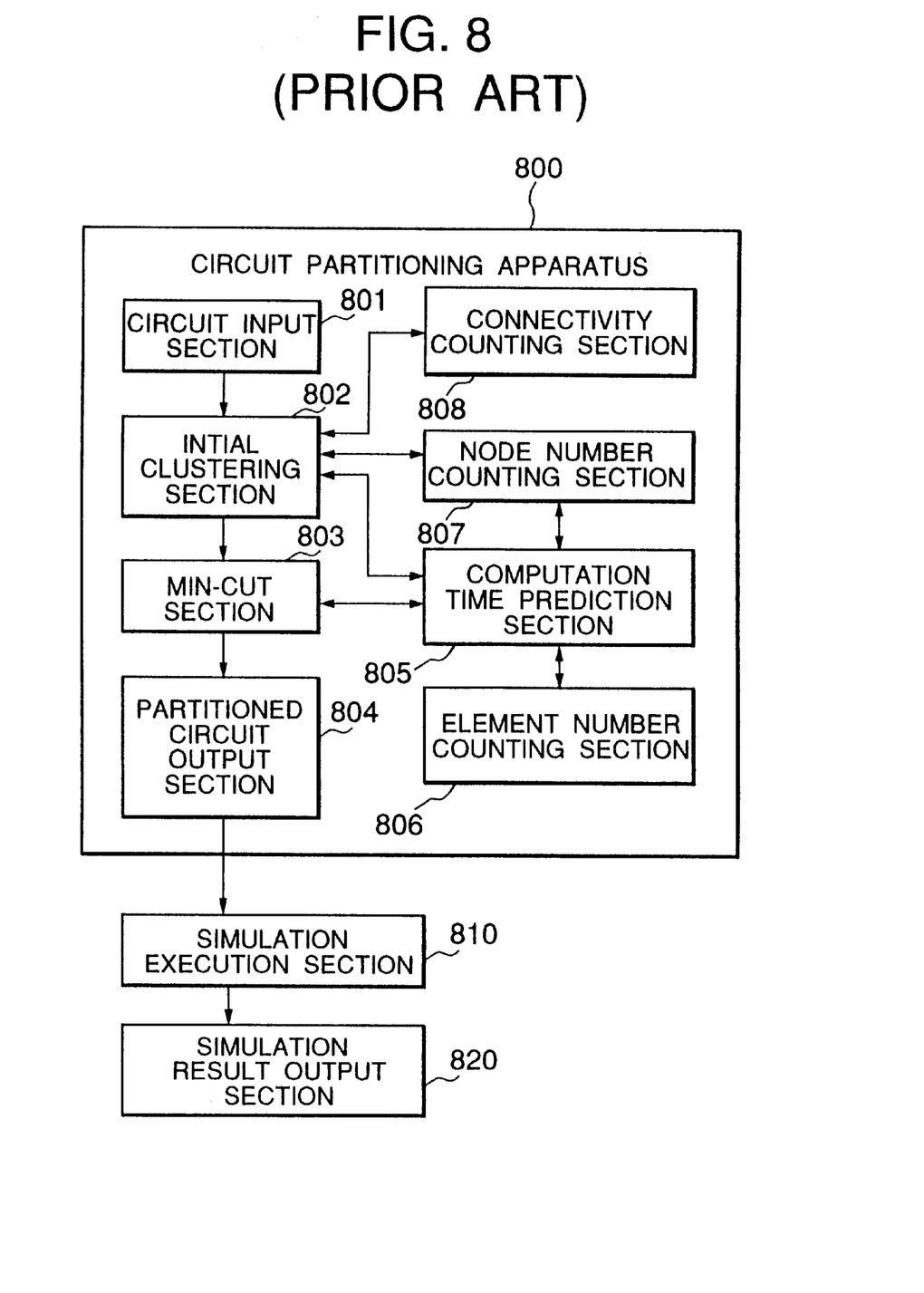
FIG. 8 is a block diagram showing the configuration of a conventional circuit partitioning apparatus.

One example of conventional techniques of this kind is disclosed in Japanese Patent Application Laid Open (Kokai) No. Heisei 1-250173 entitled "Circuit Partitioning Method for Parallel Circuit Simulation". FIG. 8 shows an example of the configuration of a conventional circuit partitioning apparatus used for parallel circuit simulation as described above. A circuit partitioning apparatus 800 shown in the Figure comprises a circuit input section 801, an initial clustering section 802, a min-cut section 803, a partitioned circuit output section 804, a computation time prediction section 805, an element number counting section 806, a node number counting section 807, and a connectivity counting section 808. In addition, the partitioned circuit output section 804 of the circuit partitioning apparatus 800 is connected to a simulation execution section 810 to execute circuit simulation. The simulation execution section 810 is further connected to a simulation result output section 820 for outputting simulation results.

The circuit input section 801 inputs an external circuit description file for a target circuit for simulation. The initial clustering section 802 repeats merging elements with a large connectivity obtained from the circuit data input to the circuit input section 801 in order to partition the circuit into clusters, each comprising a set of elements the sizes of which are as equal as possible. The connectivity of the elements is computed using the connectivity counting section 808. This process is called "initial clustering". The min-unit section 803 collects the clusters into which the circuit is partitioned by the initial clustering section 802 in order to make subcircuits. The subcircuit is made in such a way that the number of nodes connecting the subcircuits is minimized and the size of each subcircuit is equal. This process is called min-cut. The computation time prediction section 805 computes the magnitude of the load on the cluster using the element number counting section 806, which counts the number of the elements included in the subcircuit made by the min-cut section 803 and the node number counting section 807, which counts the number of nodes. The partitioned circuit output section 804 transmits to the simulation execution section 810 the information on the partitioned circuit obtained from the circuit data using the above function execution sections.

Figure 9:
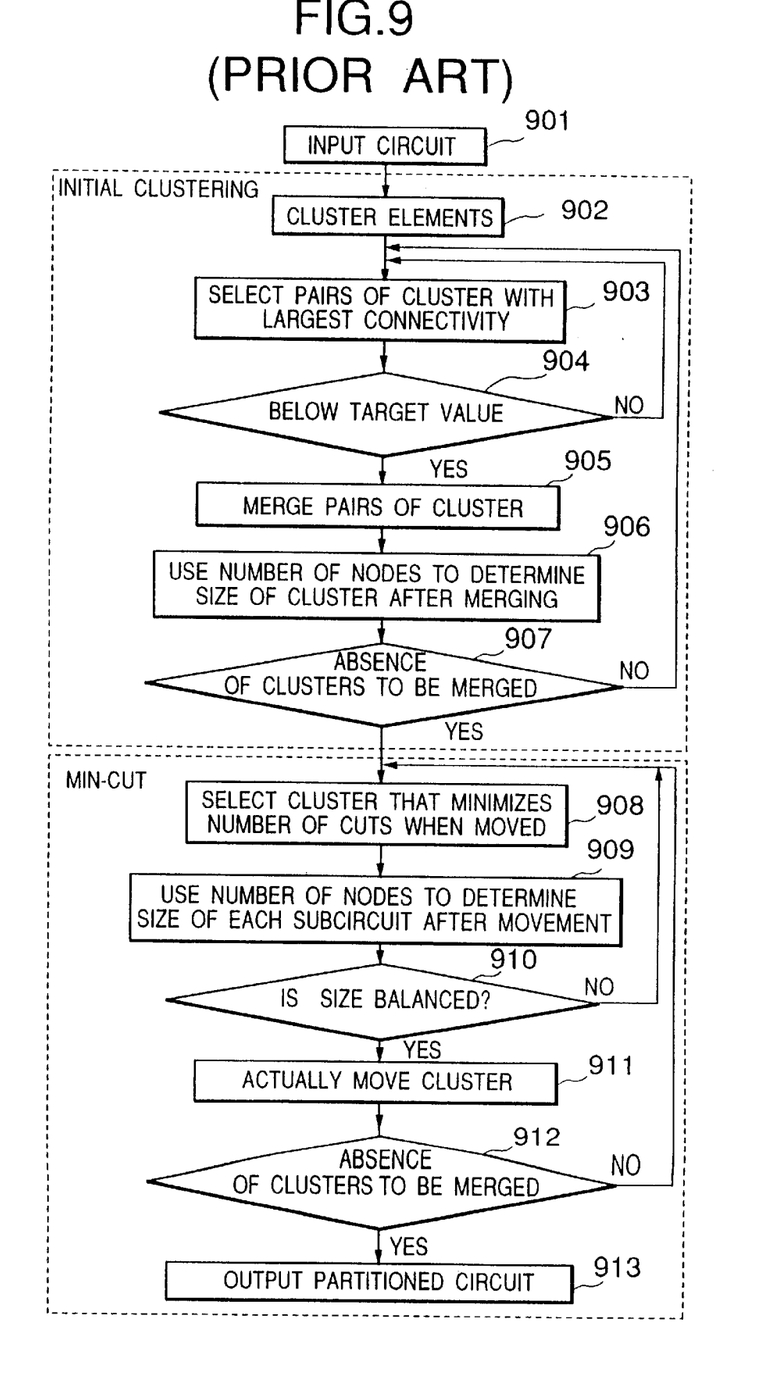
FIG. 9 is a flowchart showing a conventional circuit partitioning circuit.

FIG. 9 is a flowchart showing the flow of circuit partitioning by the conventional circuit partitioning apparatus. FIG. 9 shows that the circuit partitioning apparatus 800 inputs circuit data (step 901), carries out initial clustering (steps 902 to 907), executes min-cut (steps 908 to 912) to partition the circuit data into subcircuits, and outputs the resulting data to the simulation execution section 810 (step 913). The predicted value of the magnitude of the load on a subcircuit is the sum of the predicted value of the model computation time based on the number of elements and the predicted value of the matrix computation time based on the number of nodes, as described above. One example of such conventional circuit partitioning methods is disclosed in "Development of Parallelism for Circuit Simulation by Tearing", The European Conference on Design Automation, 1993, pp. 12–17 or Japanese Patent Application Laid Open (Kokai) No. Heisei 5-120371 entitled "Circuit Partitioning Apparatus".

The simulation execution section 810 executes parallel circuit simulation for subcircuits obtained by the conventional circuit partitioning technique. In parallel circuit simulation, a modified nodal analysis method is first applied to each subcircuit to obtain a linear simultaneous equation Ax=b. Lower/upper decomposition (hereafter referred to as "LU decomposition") for decomposing a matrix A into the product of triangular matrixes is executed until only the node potential variables of all the internal nodes have been deleted, and only the internal nodes are forward-substituted to generate an equivalent circuit as seen from the external nodes of the subcircuit. Most of the matrix computation time for parallel circuit simulation is the time required for LU decomposition executed to generate an equivalent circuit.

Figure 10:
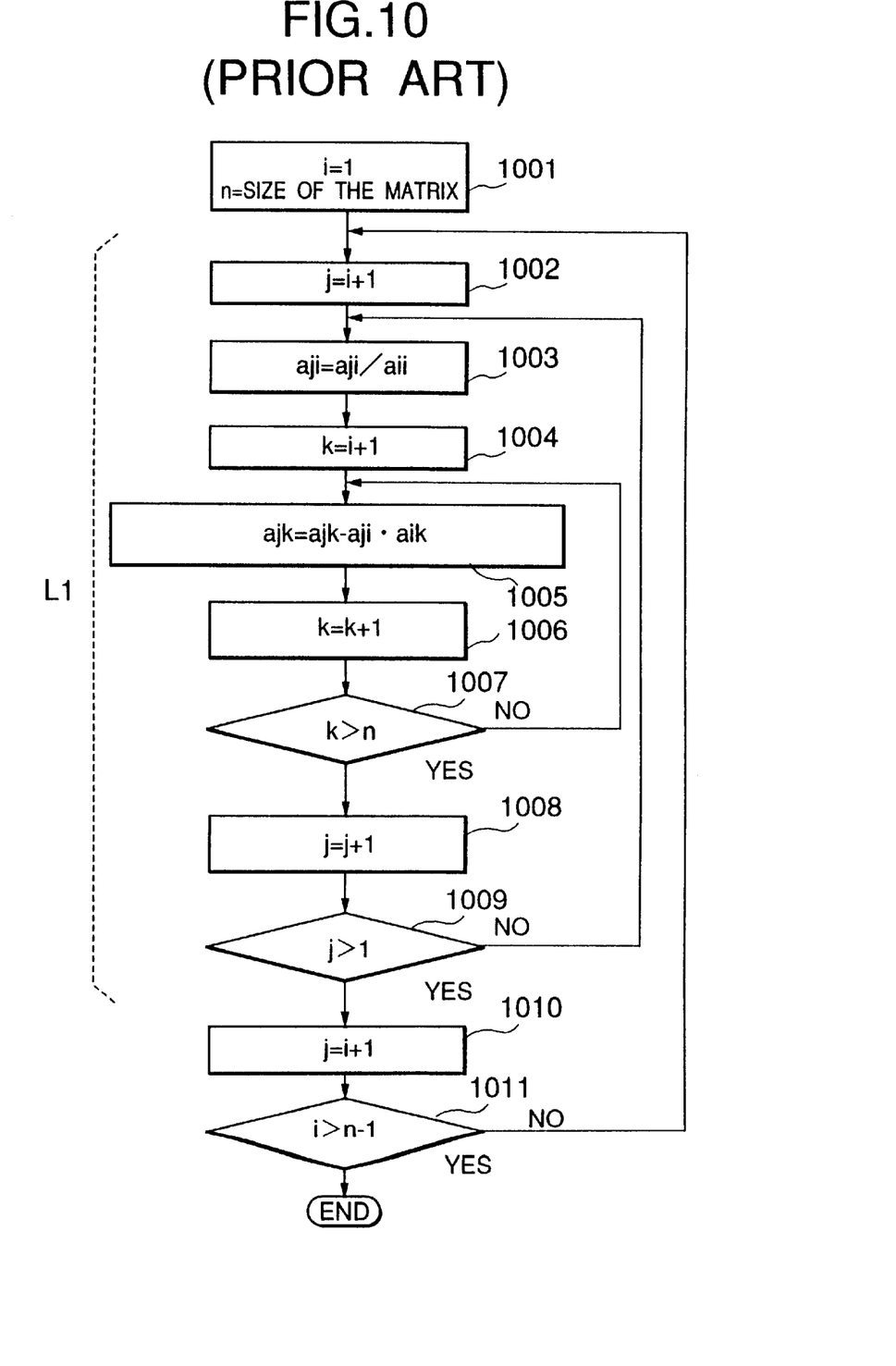
FIG. 10 is a flowchart showing LU decomposition during circuit simulation.

FIG. 10 is a flowchart showing the flow of LU decomposition. In FIG. 10, the computation in step 1005 is called "update operation". Furthermore, the process executed in two inner loops L1 is called "deletion of the i-th variable" or "deletion of the variable corresponding to the i-th node". A sparse matrix technique is generally used for such circuit simulation. If the value of $a_{ji}$ or $a_{ik}$ is "0", the update operation in step 1005 is not carried out.

As described above, if circuit simulation is executed in parallel and the magnitude of the load on each subcircuit is equal as indicated by the predicted value, the time required for simulation computations is reduced.

The circuit partitioning technique in the conventional parallel circuit simulation, however, has certain drawbacks, that is, the accuracy of the prediction of the matrix computation time is low because the number of nodes is used as a basis. In other words, since the sparse matrix technique is used for matrix computations in circuit simulation, the matrix computation time is not determined by the number of nodes (that is, the size of the matrix) but by the number of update operations in LU decomposition during simulation.

That is, when the number of the nodes included in the circuit is referred to as "N", the order of the matrix computation time varies in proportion to $N^\alpha$ ($1 \leq \alpha \leq 3$) depending on the circuit. Thus, the prediction of the matrix computation time based on the number of nodes is not very accurate.

In addition, due to the low accuracy of the prediction of the load on the subcircuit, the computation time required to simulate each subcircuit is not equal, resulting in an increase in the time required for parallel circuit simulation. That is, since the circuit is partitioned in such a way that the predicted value of the size of each subcircuit will be as equal as possible, the variation of the computation time for simulation executed for each substrate is large if the predicted value of the size (the sum of the predicted value of the model computation time and the predicted value of the matrix computation time) is not very accurate. Since the time required for parallel circuit simulation is almost equal to the sum of the longest computation time for a particular subcircuit and the computation time for a circuit that couples the subcircuits together, if the computation time for each subcircuit is not equal, the maximum value of the computation time is increased, thereby increasing the time required for parallel circuit simulation.

SUMMARY OF THE INVENTION

It is an object of this invention to provide a circuit partitioning apparatus and method that can appropriately partition a target circuit to reduce the simulation time by improving the accuracy of simulation computation time predictions for subcircuits in parallel simulations.

It is another object of this invention to provide a circuit partitioning apparatus and method that can further reduce the time required for circuit partitioning by counting the number of update computations at a high speed.

According to the first aspect of the invention, a circuit partitioning apparatus for partitioning a target circuit to execute parallel circuit simulation, the apparatus clustering an input target circuit, collecting clusters to create a plurality of subcircuits, and outputting them to a simulation execution means, comprises an initial clustering means for partitioning said target circuit into a plurality of clusters, a min-cut means for collecting clusters generated by said initial clustering means to create a plurality of subcircuits, an update operation times counting means operative prior to the execution of circuit simulation for counting the number of update operations for Lower/Upper decomposition that decomposes into the product of triangular matrixes the circuit matrix of each subcircuit composed of clusters generated by the initial clustering section, and a computation time prediction means using the results of counting by said update operation times counting means to predict the simulation computation time required by said simulation execution means, prior to the execution of circuit simulation, wherein said initial clustering means and said min-cut means feed back the results of the prediction executed by said computation time prediction means and carry out clustering and min-cut to create subcircuits that require equal computation time for circuit simulation.

The update operation times counting means may count said number of update operations using a directed graph that represents only the non-zero elements in said circuit matrix as edges.

In the preferred construction, if said initial clustering means has merged subcircuits having a known number of update operations, said update operation times counting means counts only the number of update operations required to delete variables corresponding to new internal nodes generated in the circuit after merging, and adds a count value obtained to said number of update operations.

In the preferred construction, the update operation times counting means counts said number of update operations using a directed graph that represents only the non-zero elements in said circuit matrix as edges, and if said initial clustering means has merged subcircuits having a known number of update operations, counts only the number of update operations required to delete variables corresponding to new internal nodes generated in the circuit after merging and adds a count value obtained to said number of update operations, determining the number of update operations of the circuit after merger.

According to the second aspect of the invention, a circuit partitioning method for partitioning a target circuit to execute parallel circuit simulation, the method clustering an input target circuit, collecting clusters to create a plurality of subcircuits, and outputting them to a simulation execution means; comprising the steps of:

partitioning said input target circuit into a plurality of clusters; and collecting clusters generated by said clustering step to create a plurality of subcircuits that require equal computation time for circuit simulation, wherein:

to compute the computation time required for simulation for clusters, said clustering step comprising the steps of:

prior to the execution of simulation, counting the number of update operations for Lower/Upper decomposition that decomposes into the product of triangular matrixes the circuit matrix of each subcircuit composed of clusters generated by the initial clustering section; and using the results of counting by said update operation times counting step to predict the simulation computation time required by said simulation execution means, prior to the execution of circuit simulation, and wherein to compute the computation time required for simulation for subcircuits, said min-cut step comprising:

prior to the execution of simulation, counting the number of update operations for Lower/Upper decomposition that decomposes into the product of triangular matrixes the circuit matrix of each subcircuit composed of clusters generated by the initial clustering section; and using the results of counting by said update operation times counting step to predict the simulation computation time required by said simulation execution means, prior to the execution of circuit simulation.

In this case, said update operation times counting step counts said number of update operations using a directed graph that represents only the non-zero elements in said circuit matrix as edges.

In this case, if said initial clustering step has merged subcircuits having a known number of update operations, said update operation times counting step counts only the number of update operations required to delete variables corresponding to new internal nodes generated in the circuit after merging, and adds a count value obtained to said number of update operations, determining the number of update operations of the circuit after merger.

Also, said update operation times counting step counts said number of update operations using a directed graph that represents only the non-zero elements in said circuit matrix as edges, and if said initial clustering step has merged subcircuits having a known number of update operations, said update operation times counting step counts only the number of update operations required to delete variables corresponding to new internal nodes generated in the circuit after merging and adds a count value obtained to said number of update operations, determining the number of update operations of the circuit after merger.

According to the third aspect of the invention, a computer readable memory for storing a computer program for controlling a circuit partitioning apparatus for partitioning a target circuit to execute parallel circuit simulation, the apparatus clustering an input target circuit, collecting clusters to create a plurality of subcircuits, and outputting them to a simulation execution means; said computer program comprising the steps of:

partitioning said input target circuit into a plurality of clusters; and collecting clusters generated by said clustering step to create a plurality of subcircuits that require equal computation time for circuit simulation, wherein:

to compute the computation time required for simulation for clusters, said clustering step comprising the steps of:

prior to the execution of simulation, counting the number of update operations for Lower/Upper decomposition that decomposes into the product of triangular matrixes the circuit matrix of each subcircuit composed of clusters generated by the initial clustering section; and using the results of counting by said update operation times counting step to predict the simulation computation time required by said simulation execution means, prior to the execution of circuit simulation, and wherein to compute the computation time required for simulation for subcircuits, said min-cut step comprising:

prior to the execution of simulation, counting the number of update operations for Lower/Upper decomposition that decomposes into the product of triangular matrixes the circuit matrix of each subcircuit composed of clusters generated by the initial clustering section; and using the results of counting by said update operation times counting step to predict the simulation computation time required by said simulation execution means, prior to the execution of circuit simulation.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
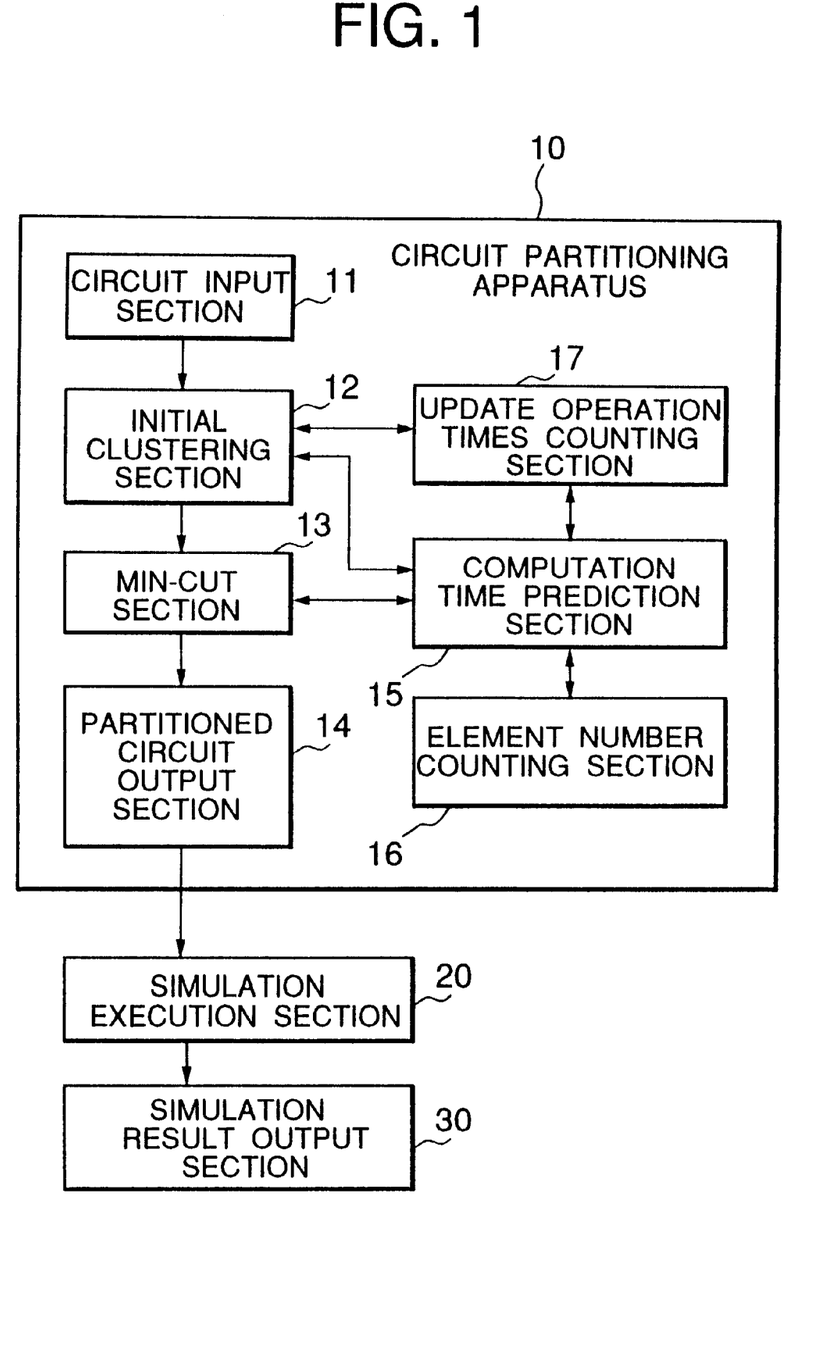
FIG. 1 is a block diagram showing the configuration of a circuit partitioning apparatus according to one embodiment of this invention.

FIG. 1 is a block diagram showing the configuration of a circuit partitioning apparatus according to one embodiment of this invention. FIG. 1 illustrates that a circuit partitioning apparatus 10 according to this embodiment comprises a circuit input section 11, an initial clustering section 12, a min-cut section 13, a partitioned circuit output section 14, a computation time prediction section 15, an element number counting section 16, and an update operation times counting section 17. In addition, the partitioned circuit output section 14 of the circuit partitioning apparatus 10 is connected to a simulation execution section 20 for executing circuit simulation. The simulation execution section 20 is also connected to a simulation result output section 30 for outputting the results of simulation.

In the above constitution, the initial clustering section 12, the min-cut section 13, the computation time prediction section 15, the element number counting section 16, and the update operation times counting section 17 are implemented by a CPU, a RAM, and other internal memories that are all controlled by a computer program. The computer program for controlling the CPU is stored in a magnetic disc, a semiconductor memory, or other storage media, and implements each function execution section by being loaded in the internal memories. The circuit input section 11 and the subcircuit output section 14 are implemented by, for example, an interface controlled by the CPU.

The circuit input section 11 loads a circuit description file for a target circuit for circuit simulation to obtain connectivity information about the circuit.

The initial clustering section 12 partitions the target circuit into clusters that each comprise a set of clusters and the sizes of which are as equal as possible, based on the circuit data input to the circuit input section 11. The update operation times counting section 17 is then used to count the number of update computations for all the clusters. In addition, since the number of update computations is determined after each merger, the number of update computations for clusters to be merged has already been determined prior to the subsequent merging. Thus, the number of update computations for the clusters after merging can be determined as the sum of the number of update computations for the clusters prior to merging and the number of update computations for new internal nodes. In this manner, the time required for counting can be significantly reduced by counting the number of update computations.

With this method, however, the variables corresponding to new internal nodes generated by merging are deleted after the variables corresponding to nodes that have been internal nodes prior to the merger. Thus, to make the order of variable deletion as equal as possible to the order in the simulation, the merging order must be controlled. This invention sequentially executes the merger of a pair of clusters for which the number of update computations per variable deletion is minimal when the variables corresponding to the new internal nodes generated by merging are deleted. Thus, the order of variable deletion is almost equal to the order of variable deletion actually executed during LU decomposition in simulation, and the accuracy of the prediction of the number of update computations is improved.

The min-cut section 13 collects clusters into which a circuit is partitioned by the initial clustering section 12 in order to make subcircuits. Each subcircuit is made in such a way that the number of nodes connecting the subcircuits is minimized and the size of each subcircuit is the same. As a result of initial clustering, the number of update computations for all the clusters is known. Thus, the number of update computations for a subcircuit comprising a set of several clusters can be computed by merging all the clusters included in the subcircuit, as in the counting of update computations during initial clustering.

The computation time prediction section 15 predicts the magnitude of the load on each subcircuit occurring when simulation is executed by the simulation execution section 20, that is, the computation time during simulation. The predicted value of the magnitude of the load is used during subsequent processing for clustering by the initial clustering section 12 and for the creation of subcircuits by the min-cut section 13. In this case, the element number computation section 16 is used to count the number of elements Nt in order to predict the model computation time by Kt Nt. In addition, the update operation times counting section 17, which is a feature of this invention, is used to count the number of update operations Nu to predict the matrix computation time during simulation by Ku Nu. The predicted value of the magnitude is then determined by adding these values together. If the model computation time for a single transistor is referred to as Tt and the time required for a single update operation is referred to as Tu, the values of coefficients Kt and Ku are set so that Kt:Ku=Tt:Tu. If each computation is carried out by the same computer, this value will be between about 100:1 and 200:1.

To delete the variables corresponding to particular nodes in LU decomposition during simulation, the update operation times counting section 17 determines the total update operations required to sequentially delete all the relevant variables by counting the number of the update operations prior to the execution of simulation without the use of matrix computations. In this case, the order of variable deletion is such that the variable that requires the smallest number of update operations is deleted first. This is because the actual variable deletion in LU decomposition during simulation is executed in this order. This causes fill-in to be generated in the same manner during both circuit partitioning (prediction) and simulation, so the predicted value of the number of update operations during circuit partitioning is equal to that during simulation.

In addition, the value of each element of a circuit matrix is not important when the number of update operations is counted, and only the non-zero element pattern needs to be known. Then, a directed graph G=(V, E) representing the presence of a non-zero element $a_{ij}$ as the presence of a edge (j, i) is used to express the non-zero element pattern. If the matrix size is referred to as "n", V={1, 2, ..., n} and E={{(j, i) $|a_{ij} \approx 0$}. In LU decomposition, the number of update operations required to delete the i-th variable is determined by computing the product of the number of edges (k, i) coming in node (i) in a directed graph and the number of edges (i, i) leaving this node. Edge (i, i), however, is not counted either way of incoming edges or outgoing edges. In addition, a set of edges corresponding to elements, the values of which are updated during variable deletion, are a set of edges (k, l) comprising an arbitrary combination of nodes (k) and (l) connected to the incoming and outgoing edges. Those edges in the set which are not yet present in the graph are added to the graph as required as fill-in.

The partitioned circuit output section 14 transmits to the simulation execution section 20 the subcircuits obtained by partitioning the target circuit.

Figure 2:
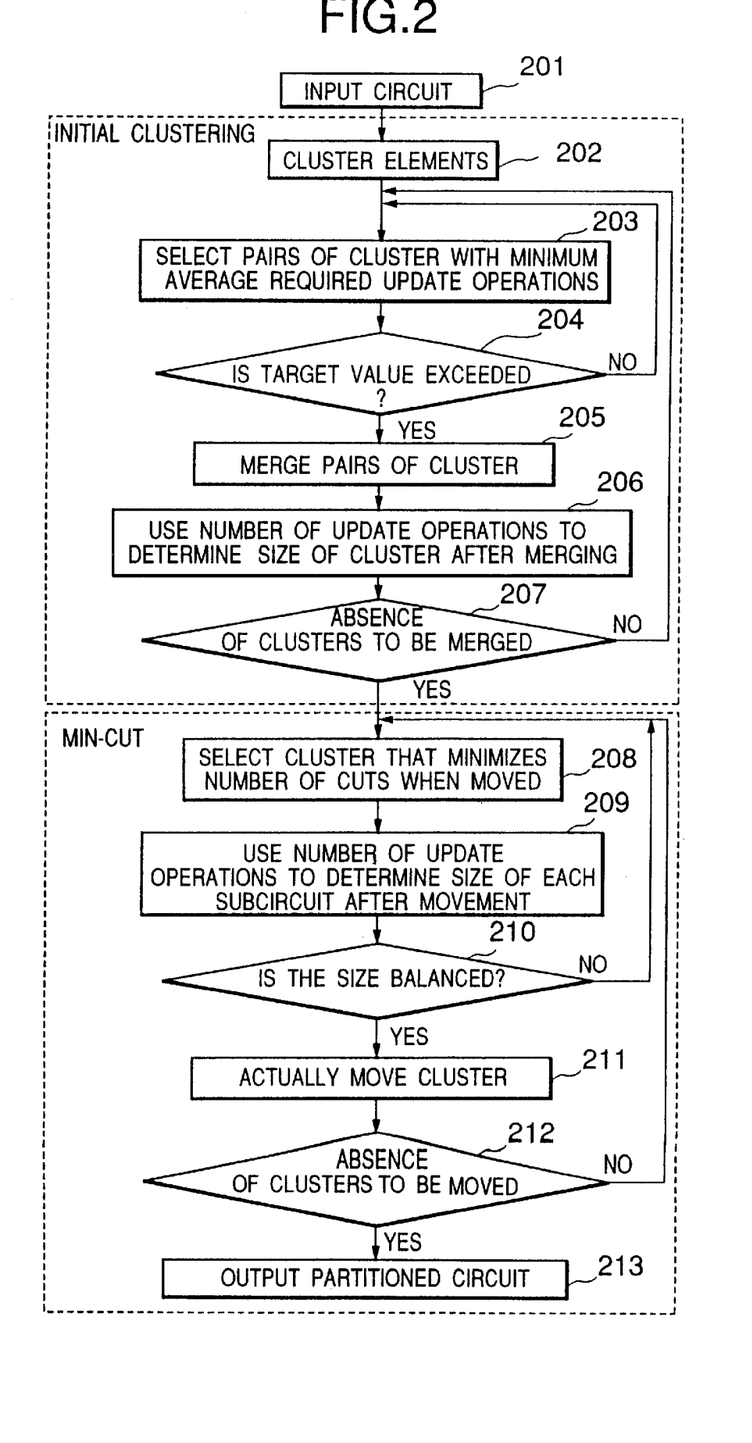
FIG. 2 is a flowchart showing the operation of this embodiment.
Figure 3:
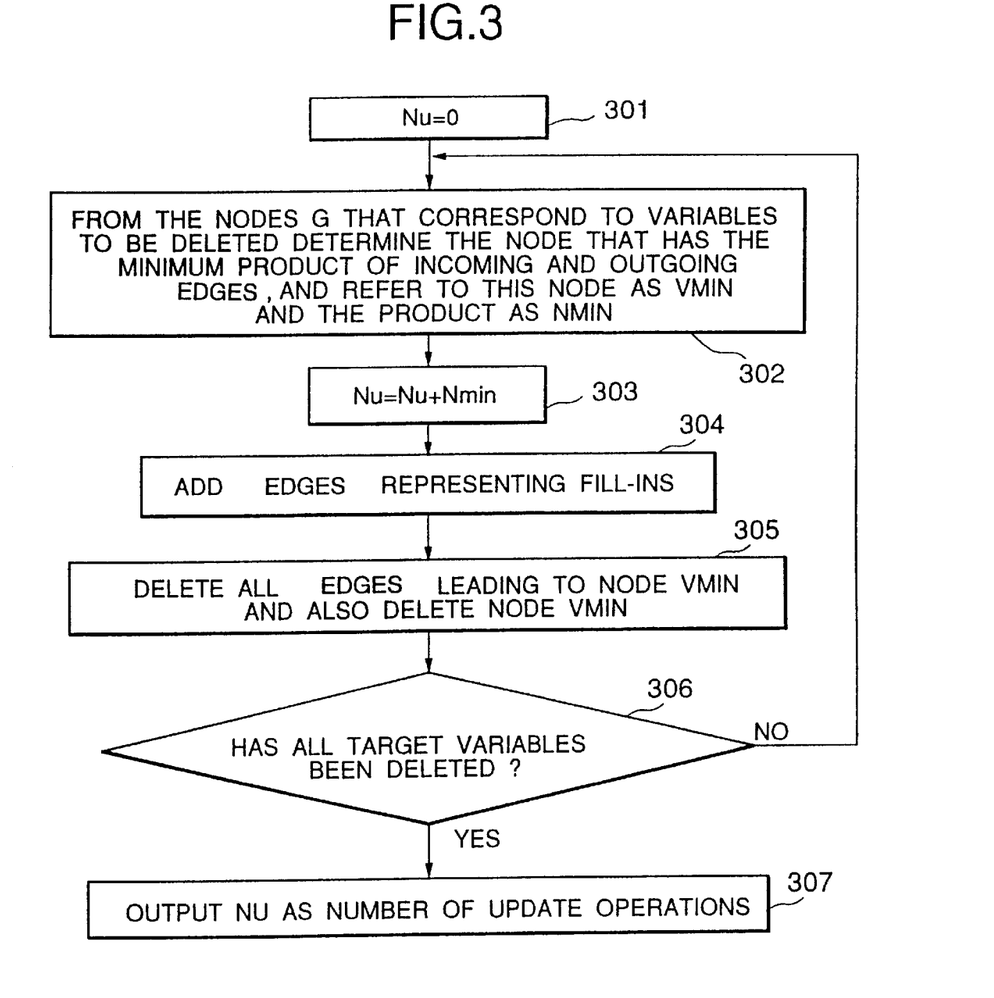
FIG. 3 is a flowchart showing the counting of update operation times in this embodiment.
Figure 4A:
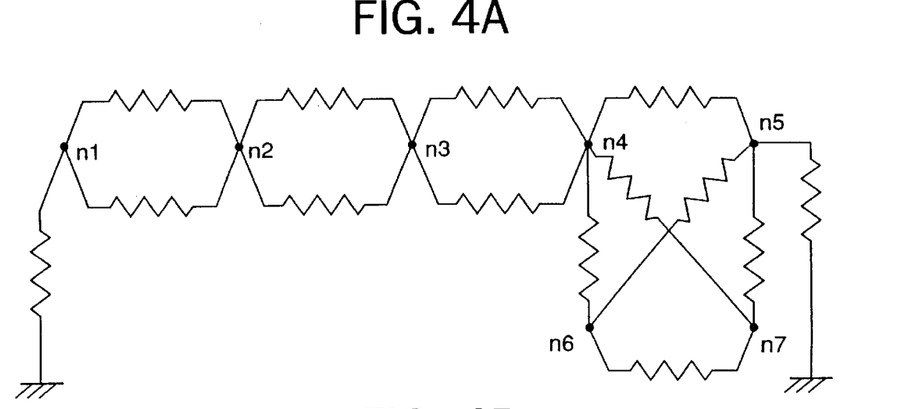
FIG. 4A is a circuit diagram showing a circuit to be processed in this embodiment.
Figure 4B:
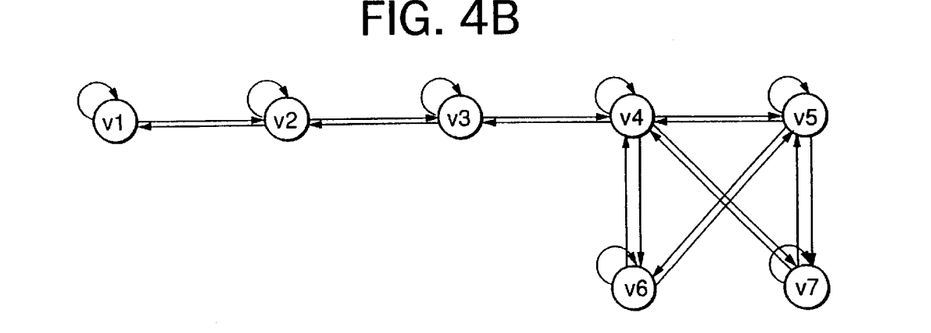
FIG. 4B shows a directed graph representation of the circuit in FIG. 4A.
Figure 5:
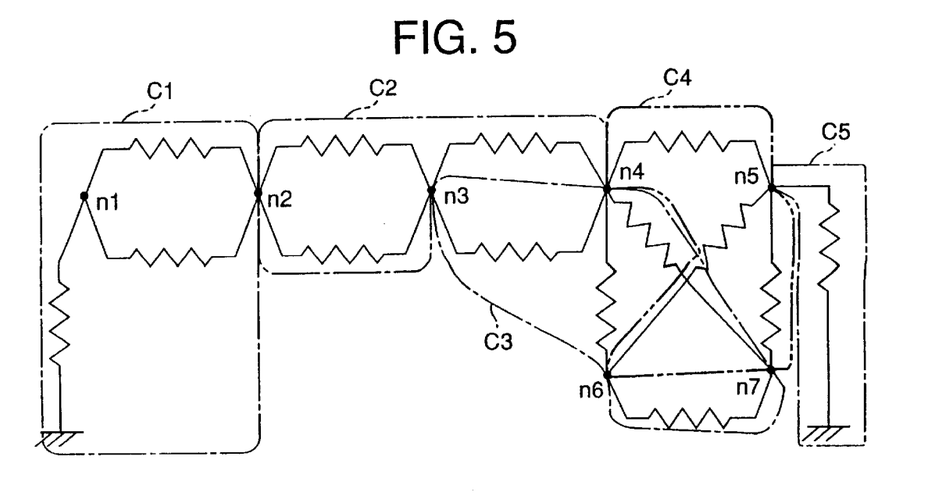
FIG. 5 is a circuit diagram showing the circuit in FIG. 4A after initial clustering according to this embodiment.
Figure 6:
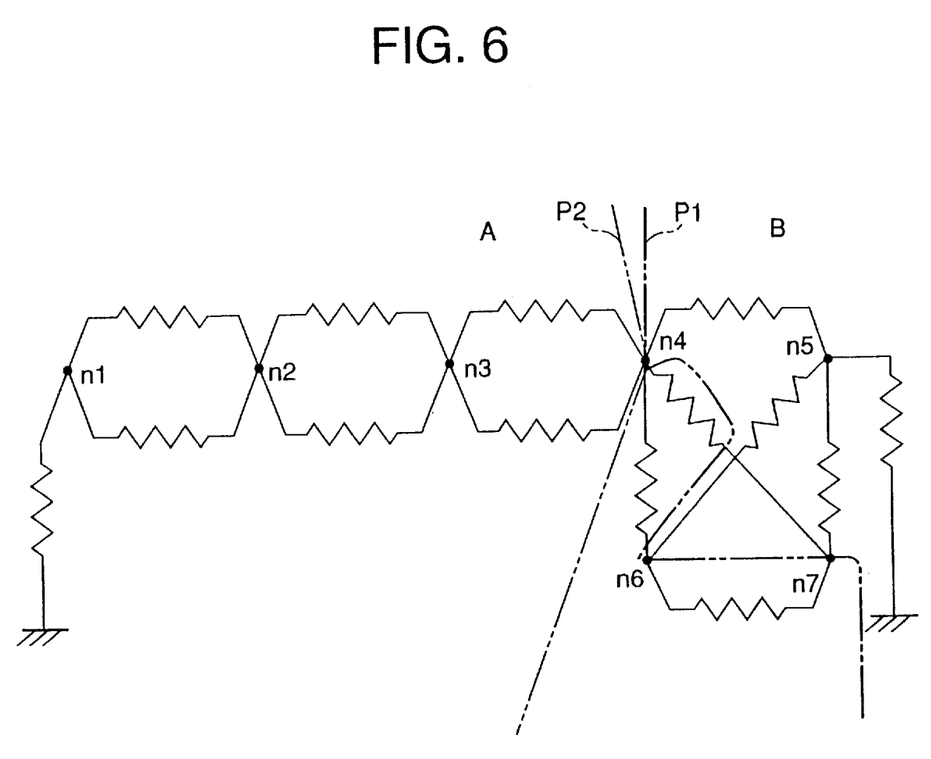
FIG. 6 is a circuit diagram showing the circuit in FIG. 4A after min-cut according to this embodiment.

Next, the operation of this embodiment is described. FIG. 2 is a flowchart showing processing by the circuit partitioning apparatus 10 according to this embodiment. FIG. 3 is a flowchart showing the process of counting the number of update operations by the update operation times counting section 17. FIGS. 4 to 6 are explanatory drawings showing an example of the circuit and its representation by directed graph during a circuit partitioning process.

When data on the circuit diagram shown in FIG. 4A is input by the circuit input 11 (step 201), the initial clustering section 12 carries out initial clustering for the target circuit (step 202). This results in directed graph G, which represents a non-zero pattern of the circuit matrix obtained when a nodal analysis method is applied to the overall circuit, using each element as a cluster, as shown in FIG. 4B. The computation time prediction section 15 then determines the load on each cluster. For all the pairs of clusters, the update operation times counting section 17 then computes the number of update computations Nuin required to delete all the Nin variables corresponding to new internal nodes generated by the merge. The pair of clusters with a minimum average number per variable Nuin/Nin is selected as a candidate for merging (step 203). The number of update computations is counted using directed graph G and a set of variables to be deleted, as shown in FIG. 3.

Then, before actually merging a candidate pair of clusters, the computation time prediction section 15 is used to determine the magnitude of the load after merging as the sum of the size of the two clusters and Ku Nuin, and merging is executed only if the computed value does not exceed the target magnitude (steps 204 and 205). If the value exceeds the target magnitude, this pair of clusters will not be used as a candidate for merging in the subsequent processing. Then, after merging has been carried out, the sum of the size of the two clusters prior to merging and Ku Nuin is set as the size of the clusters after merging (step 206). The processing in steps 203 to 206 is repeated until there are no more clusters to be merged in order to make the sizes of all the clusters almost equal (step 207). For example, if the circuit shown in FIG. 4A is subjected to initial clustering by assuming the target magnitude of the load to be "4"; Kt in the prediction equation of model computation time Kt Nt to be "1"; Nt to be the number of resistance elements; and Ku in the prediction equation of matrix computation time to be "1", it will be partitioned into clusters C1 to C5 as shown in FIG. 5.

The min-cut section 13 then carries out min-cut using the results of the processing by the initial clustering section 12. First, the cluster that minimizes the number of cuts when moved is selected (step 208). The computation time prediction section 15 is then used to compute the magnitude of the load of each subcircuit after the movement of the selected cluster. If the magnitude is well-balanced, the cluster is actually moved (steps 209 to 211). The processing in steps 208 to 211 is repeated until there are no more clusters to be moved (step 212). Finally, the circuit shown in FIG. 4 is partitioned into a subcircuit A to the left of a boundary P1 and a subcircuit B to the right thereof as shown in FIG. 6.

If the actual computation time for the simulation means is assumed to be Kt Nt+Ku Nu seconds, the computation time for the subcircuit A is 13 seconds and the computation time for the subcircuit B is also 13 seconds. Since the matrix computation time for the coupled section (coupled circuit) of these subcircuits can be determined as 5 seconds from the number of update operations, the computation time for the overall circuit is 13+5=18 seconds if the computations of the subcircuits are executed in parallel. In this case, Kt=Ku=1, the value of Nt is the number of resistance elements included in a subcircuit, and the value of Nu is the number of update operations executed for a subcircuit or a coupled circuit.

On the other hand, the results of partition using a conventional circuit partitioning apparatus shown in FIGS. 8 and 9 are the partition using P2 as a boundary as shown in FIG. 6. In this case, the computation time is also unequal; the computation time for the subcircuit A is 10 seconds and the computation time for the subcircuit B is 21 seconds if the actual computation time for the simulation means is Kt Nt+Ku Nu. The matrix computation time for the coupled portion is 10 seconds, whereas the computation time for the overall circuit is 21 seconds. This indicates that this embodiment can reduce the computation time required to partition a circuit.

Figure 7:
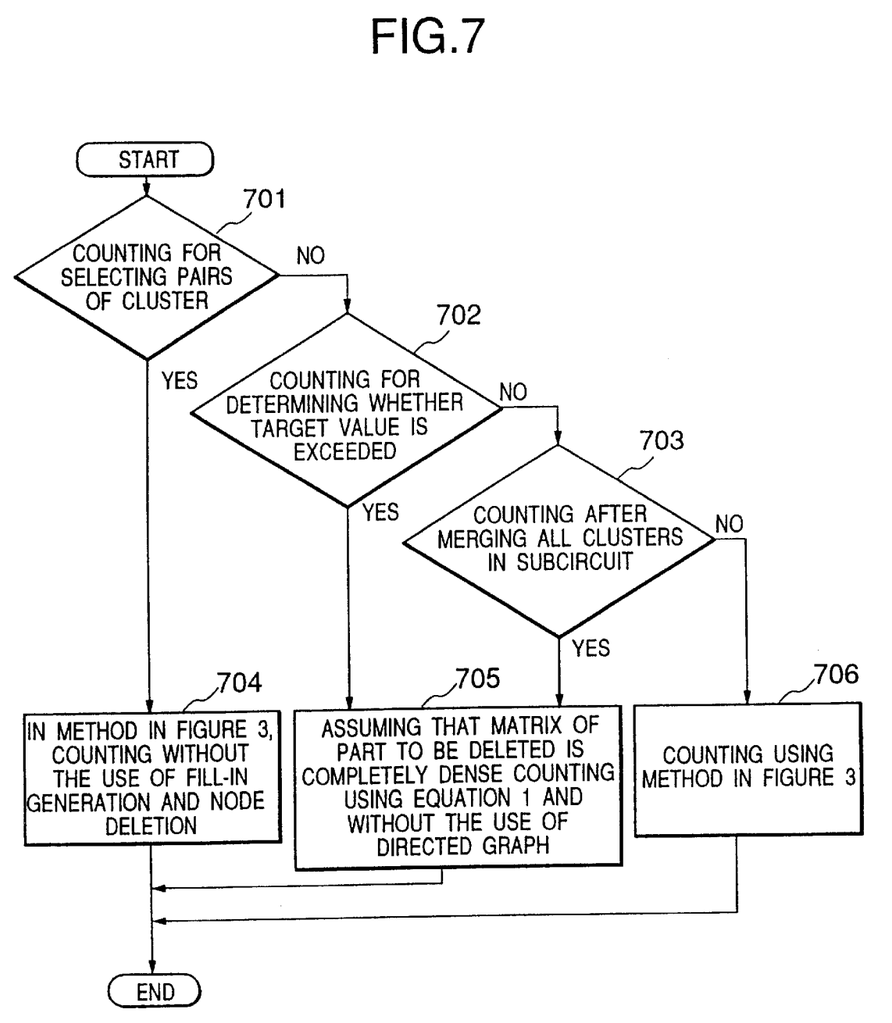
FIG. 7 is a flowchart showing another example of the counting of update operation times in this embodiment.

FIG. 7 is a flowchart showing another update operation times counting method executed by the update operation times counting section 17 according to this invention. According to the update operation times counting method shown in FIG. 7, a plurality of update operation times determination methods are provided and one of them is selected depending on a required accuracy and speed. That is, in selecting a pair of clusters during initial clustering (step 203, FIG. 2), the number of update operations is computed (steps 701 and 704) without adding edges (branches) corresponding to fill-ins generated by update operations (step 304, FIG. 3) or deleting nodes corresponding to deleted variables (step 305). In addition, in counting the number of update operations when it is determined whether the value exceeds a target magnitude (step 204, FIG. 2) and when all the clusters included in the subcircuit are merged during min-cut (step 209), it is assumed that the matrix is completely dense (no elements are zero), and the number of update operations Nuin required when a variable corresponding to a new internal node is deleted is computed based on the number of new internal nodes Nin generated by merging and the number of external nodes after merging, using equation (1) and without the use of a directed graph (steps 702, 703, 705).

$$N_{uin} = \sum_{k=N_x}^{N_{in}+N_x-1} k^2 \quad (1)$$

In other cases, computations are carried out using a directed graph as shown in FIG. 3 (step 706).

As a variation of this embodiment, instead of using min-cut, one cluster can be selected from both sides of the partitioned position of the circuit and the two clusters are simultaneously exchanged. In addition, after a hierarchical clustering has been executed to avoid local optimal solutions, min-cut is carried out for each hierarchy starting with the highest hierarchy (the hierarchy with the smallest number of clusters) using cluster movement or exchange.

As described above, the circuit partitioning apparatus according to this invention predicts the matrix computation time based on the number of update operations, and accordingly it can predict more accurately the computation time for each cluster (subcircuit) which is executed during circuit partitioning. This is because the computation time for each circuit is almost equal to the sum of the model computation time and matrix computation time and because the matrix computation time is almost equal to the time required for update operations for LU decomposition. This invention thus equalizes the computation time required by the simulation time for each subcircuit, thereby reducing the time required for parallel circuit simulation.

In addition, the circuit partitioning apparatus according to this invention can count the number of update operations at a high speed. This is because the predicted value of the magnitude of the load on the clusters after merging is determined as the sum of the magnitude of the load on the clusters prior to merging and the number of update operations required when only variables corresponding to new internal nodes are deleted. In addition, due to the use of a directed graph that uses non-zero elements in a non-zero pattern in a circuit matrix as edges, the number of update operations required to delete variables can be determined easily.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A circuit partitioning apparatus for partitioning a target circuit to execute parallel circuit simulation, the apparatus clustering an input target circuit, collecting clusters to create a plurality of subcircuits, and outputting the subcircuits to a simulation execution means, comprising:

an initial clustering means for partitioning said target circuit into a plurality of clusters;

a min-cut means for collecting clusters generated by said initial clustering means to create the plurality of subcircuits, where each subcircuit comprises a circuit matrix;

Lower/Upper decomposition means for decomposing the circuit matrix of each subcircuit composed of clusters generated by the initial clustering section into a product of triangular matrices;

an update operation times counting means operative prior to the execution of circuit simulation for counting a number of update operations for said Lower/Upper decomposition using a directed graph, where each update operation is defined as a matrix operation required to generate each elemet of said triangular matrices from the circuit matrix of each subcircuit; and a computation time prediction means using the results of counting by said update operation times counting means to predict a simulation computation time required by said simulation execution means, prior to the execution of circuit simulation, wherein said initial clustering means and said min-cut means feed back the results of the simulation computation time predicted by said computation time prediction means and carry out clustering and min-cut to create subcircuits that require equal computation time for each subcircuit's simulation.

2. A circuit partitioning apparatus as set forth in claim 1, wherein if said initial clustering means has merged subcircuits having a known number of update operations, said update operation times counting means counts only the number of update operations required to delete variables corresponding to new internal nodes generated in the circuit after merging, and adds a count value obtained to said number of update operations.

3. A circuit partitioning apparatus as set forth in claim 1, wherein said update operation times counting means counts said number of update operations using a directed graph that represents only the non-zero elements in said circuit matrix as edges, and if said initial clustering means has merged subcircuits having a known number of update operations, counts only the number of update operations required to delete variables corresponding to new internal nodes generated in the circuit after merging and adds a count value obtained to said number of update operations, determining the number of update operations of the circuit after merger.

4. A circuit partitioning method for partitioning a target circuit to execute parallel circuit simulation, the method comprising the steps of:

partitioning the target circuit into a plurality of clusters;

collecting clusters generated in said step of partitioning to create a plurality of subcircuits;

creating a matrix for each subcircuit;

decomposing the circuit matrix of each subcircuit composed of clusters generated by the initial clustering section into a product of triangular matrices;

counting the number of update operations for the Lower/Upper decomposing using a directed graph, where each update operation is defined as a matrix operation required to generate each element of said triangular matrices from the circuit matrix of each subcircuit;

predicting the simulation computation time required for simulating said subcircuits based on said counting;

feeding back said predicted computation time for further partitioning and further clustering to arrange that said subcircuits require equal computation time for simulation; and outputting said subcircuits for circuit simulation.

5. A circuit partitioning method as set forth in claim 4, wherein if said step of collecting clusters has merged subcircuits having a known number of update operations, said update operation times counting step counts only the number of update operations required to delete variables corresponding to new internal nodes generated in the circuit after merging, and adds a count value obtained to said number of update operations, determining the number of update operations of the circuit after merger.

6. A circuit partitioning method as set forth in claim 4, wherein said counting step counts said number of update operations using a directed graph that represents only the non-zero elements in said circuit matrix as edges, and if said step of collecting clusters has merged subcircuits having a known number of update operations, said update operation times counting step counts only the number of update operations required to delete variables corresponding to new internal nodes generated in the circuit after merging and adds a count value obtained to said number of update operations, determining the number of update operations of the circuit after merger.

7. A computer readable memory for storing a computer program for controlling a circuit partitioning apparatus for partitioning a target circuit to execute parallel circuit simulation, said computer program comprising the steps of:

partitioning the target circuit into a plurality of clusters;

collecting clusters generated in said step of partitioning to create a plurality of subcircuits;

creating a matrix for each subcircuit;

decomposing the circuit matrix of each subcircuit composed of clusters generated by the initial clustering section into a product of triangular matrices;

counting the number of update operations for the Lower/Upper decomposing using a directed graph, where each update operation is defined as a matrix operation required to generate each element of said triangular matrices from the circuit matrix of each subcircuit;

predicting the simulation computation time required for simulating said subcircuits based on said counting;

feeding back said predicted computation time for further partitioning and further clustering to arrange said subcircuits require equal computation time for simulation; and outputting said subcircuits for circuit simulation.

8. A computer readable memory as set forth in claim 7, wherein if said step of collecting clusters has merged subcircuits having a known number of update operations, said update operation times counting step of said computer program counts only the number of update operations required to delete variables corresponding to new internal nodes generated in the circuit after merging, and adds a count value obtained to said number of update operations, determining the number of update operations of the circuit after said merger.

9. A computer readable memory as set forth in claim 7, wherein said counting step of said computer program counts said number of update operations using a directed graph that represents only the non-zero elements in said circuit matrix as edges, and if said step of collecting clusters has merged subcircuits having a known number of update operations, counts only the number of update operations required to delete variables corresponding to new internal nodes generated in the circuit after merging and adds a count value obtained to said number of update operations determining the number of update operations of the circuit after said merger.

* * * * *